(12) United States Patent
Liu

(10) Patent No.: US 12,660,312 B2
(45) Date of Patent: Jun. 16, 2026

(54) BACKLIGHT MODULE AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Junling Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 535 days.

(21) Appl. No.: 17/251,288

(22) PCT Filed: Nov. 20, 2020

(86) PCT No.: PCT/CN2020/130443
§ 371 (c)(1),
(2) Date: Dec. 11, 2020

(87) PCT Pub. No.: WO2022/077704
PCT Pub. Date: Apr. 21, 2022

(65) Prior Publication Data

US 2022/0302181 A1 Sep. 22, 2022

(30) Foreign Application Priority Data

Oct. 16, 2020 (CN) ......................... 202011108559.8

(51) Int. Cl.
*H10D 86/01* (2026.01)
*H10D 86/40* (2025.01)
*H10D 86/60* (2025.01)

(52) U.S. Cl.
CPC ....... *H10D 86/0231* (2025.01); *H10D 86/441* (2025.01); *H10D 86/60* (2025.01)

(58) Field of Classification Search
CPC ............. H01L 27/3276; H01L 27/3258; H01L 27/1288; H01L 27/124; H01L 27/1248;
(Continued)

(56) References Cited

U.S. PATENT DOCUMENTS

2009/0047749 A1* 2/2009 Lin .................... H01L 27/1214
257/E33.001
2016/0043117 A1* 2/2016 Guo ..................... H01L 27/124
438/158

(Continued)

FOREIGN PATENT DOCUMENTS

CN 110471219 A 11/2019
CN 110931620 A 3/2020

(Continued)

OTHER PUBLICATIONS

CN 111584512, machine translation (Year: 2023).*

*Primary Examiner* — Lauren R Bell
(74) *Attorney, Agent, or Firm* — The Roy Gross Law Firm, LLC; Roy D. Gross

(57) ABSTRACT

A manufacturing method of a backlight module is provided, which includes forming a first conductive layer and a first insulating layer on a substrate, forming an active material layer on the first conductive layer, patterning the first insulating layer and the active material layer by using a multi-tone photomask to expose a portion of the first conductive layer and cause the active material layer to form an active member, and forming a third conductive layer on the active member to form a source and drain of the backlight module.

18 Claims, 7 Drawing Sheets

(58) Field of Classification Search
CPC . H01L 27/156; H01L 2227/323; H01L 33/62; H01L 2933/0066; H01L 25/075; H10K 59/131; H10K 59/124; H10K 59/1201; H10D 86/441; H10D 86/0231; H10D 86/451; H10W 90/00; H10H 29/012; H10H 29/30–49
See application file for complete search history.

(56) References Cited

U.S. PATENT DOCUMENTS

| | | | | |
|---|---|---|---|---|
| 2021/0225878 | A1* | 7/2021 | Koo | H01L 33/62 |
| 2021/0335830 | A1* | 10/2021 | Zhang | H10D 86/60 |
| 2021/0358975 | A1* | 11/2021 | Li | H10D 86/60 |
| 2023/0154932 | A1* | 5/2023 | Zhao | H10D 86/60<br>257/72 |

FOREIGN PATENT DOCUMENTS

| | | | |
|---|---|---|---|
| CN | 111477638 | A | 7/2020 |
| CN | 111584512 | A | 8/2020 |
| CN | 211265505 | U | 8/2020 |
| IN | 109741684 | A | 5/2019 |
| KR | 20190116178 | A | 10/2019 |

* cited by examiner

BACKLIGHT MODULE AND MANUFACTURING METHOD THEREOF

CROSS REFERENCE TO RELATED APPLICATIONS

This application is a National Phase of PCT Patent Application No. PCT/CN2020/130443 having International filing date of Nov. 20, 2020, which claims the benefit of priority of Chinese Application No. 202011108559.8 filed on Oct. 16, 2020. The contents of the above applications are all incorporated by reference as if fully set forth herein in their entirety.

FIELD OF INVENTION

This application relates to the field of display, in particular to a backlight module and a manufacturing method thereof.

BACKGROUND OF INVENTION

Current backlight module of light-emitting diode display device usually includes a driving circuit board and light-emitting diodes on the driving circuit board, such as micro light-emitting diodes (LEDs) or mini LEDs. Therefore, design of a structure of the backlight module is particularly important for high-resolution products.

Metal oxide has advantages such as higher mobility, adaptability to low-temperature processes, excellent uniformity, and excellent surface flatness, so this material is often used in manufacturing of backplanes. A traditional backplane channel etching structure usually requires four photomask processes and two metal layers of a bonding terminal formed by bridging indium tin oxide. However, since the indium tin oxide has a large resistance and is prone to aging, it causes uneven display and malfunctions will occur during LEDs lighting process, which seriously affects production yield. Secondly, current driving circuit board manufacturing process usually requires multiple photomasks and multiple wet etching and dry etching processes. Excessive number of etching times increases difficulty in the manufacturing of the driving circuit board, resulting in an increase in cost.

Therefore, there is an urgent need for a backlight module and a manufacturing method thereof to solve the above technical problems.

Technical Problem

The present application provides a backlight module and a manufacturing method thereof, so as to solve the technical problem of complicated manufacturing processes of current light-emitting diode display devices.

SUMMARY OF INVENTION

This application provides a manufacturing method of a backlight module, including: forming a first conductive layer on the substrate, and patterning the first conductive layer to form a first electrode of a first terminal of the backlight module; forming a first insulating layer and an active material layer on the first conductive layer; patterning the first insulating layer and the active material layer by using a multi-tone photomask to expose a portion of the first conductive layer and cause the active material layer to form an active member; forming a third conductive layer on the active member to form a source and drain of the backlight module, a second electrode of the first terminal, and a first bonding electrode of a second terminal of the backlight module; forming a second insulating layer on a remaining portion of the third conductive layer; and forming a fourth conductive layer on the second insulating layer, and patterning the fourth conductive layer to form a third electrode of the first terminal.

In the manufacturing method of the backlight module of the present application, steps of forming the first conductive layer on the substrate, and patterning the first conductive layer to form the first electrode of the first terminal of the backlight module include: forming the first conductive layer on the substrate and patterning the first conductive layer by using a first photomask and a first etching process to form a gate of the backlight module and the first electrode of the first terminal of the backlight module.

In the manufacturing method of the backlight module of the present application, steps of patterning the first insulating layer and the active material layer by using the multi-tone photomask to expose the portion of the first conductive layer, and cause the active material layer to form the active member include: forming a photoresist material layer on the active material layer; patterning the photoresist material layer by using a second photomask to form a first photoresist area and a second photoresist area separated from each other and a first opening area positioned between the first photoresist area and the second photoresist area; removing portions of the first insulating layer and the first conductive layer that are not covered by the first photoresist area and the second photoresist area by a second etching process, to form a first via-hole to expose the first electrode corresponding to the first opening area; performing an ashing treatment on photoresist material in the first photoresist area and the second photoresist area, and retaining the photoresist material in a portion of the second photoresist area; and removing the active material layer that is not covered by the portion of the photoresist material in the second photoresist area by a third etching process to form the active member.

In the manufacturing method of the backlight module of the present application, the second photoresist area includes a first photoresist sub-area, a second photoresist sub-area, and a third photoresist sub-area connected to each other, a thickness of the first photoresist sub-area is less than a thickness of the second photoresist sub-area, and is less than a thickness of the third photoresist sub-area, and the thickness of the first photoresist sub-area is equal to a thickness of the first photoresist area.

In the manufacturing method of the backlight module of the present application, steps of performing the ashing treatment on the photoresist material in the first photoresist area and the second photoresist area, and retaining the photoresist material in the portion of the second photoresist area include removing a photoresist material of the first photoresist sub-area in the first photoresist area and the second photoresist area and reducing the thickness of the second photoresist sub-area and the thickness of the third photoresist sub-area in the second photoresist area to form the portion of the second photoresist area.

In the manufacturing method of the backlight module of the present application, the multi-tone photomask includes a first photomask area, a second photomask area, and a third photomask area. The first photomask area corresponds to the first opening area, the second photomask area corresponds to the first photoresist area and the first photoresist sub-area, and the third photomask area corresponds to the second photoresist sub-area and the third photoresist sub-area. The light transmittance of the first photomask area, the second photomask area, and the third photomask area gradually increase or decrease.

In the manufacturing method of the backlight module of the present application, steps of forming the third conductive layer on the active member to form the source and drain of the backlight module, the second electrode of the first terminal, and the first bonding electrode of the second terminal of the backlight module include forming the third conductive layer on the active member; patterning the third conductive layer by using a third photomask and a fourth etching process to form the source and drain of the backlight module, the second electrode of the first terminal, and the first bonding electrode of the second terminal; wherein the source and drain are positioned on the active member, and the second electrode is electrically connected to the first electrode through the first via-hole.

In the manufacturing method of the backlight module of the present application, steps of forming the second insulating layer on the remaining portion of the third conductive layer include patterning the second insulating layer by using a fourth photomask and a fifth etching process to form a second via-hole on the second electrode and a second opening on the first bonding electrode.

In the manufacturing method of the backlight module of the present application, steps of forming the fourth conductive layer on the second insulating layer, and patterning the fourth conductive layer to form the third electrode of the first terminal include forming the fourth conductive layer on the second insulating layer; patterning the fourth conductive layer by using a fifth photomask to form the third electrode of the first terminal to cause the third electrode to electrically connect to the second electrode through the second via-hole, or patterning the fourth conductive layer by using a fifth photomask to form the third electrode of the first terminal and a second bonding electrode of the second terminal, wherein the third electrode is electrically connected to the second electrode through the second via-hole and the second bonding electrode is electrically connected to the first bonding electrode through the second opening.

The application also proposes a backlight module, which includes a light-emitting area and a first bonding area away from the light-emitting area.

A plurality of light-emitting units are arranged in the light-emitting area, any of the plurality of light-emitting units includes a substrate, a gate positioned on the substrate, a first insulating layer positioned on the gate, an active member positioned on the first insulating layer, a source and drain positioned on the active member, a second insulating layer positioned on the source and drain, a second terminal positioned in the second insulating layer, and a light-emitting device positioned on the second terminal, the second terminal comprises a first bonding electrode that is disposed on a same layer as the active member and formed in a same process as the source and drain.

At least one first terminal is disposed in the first bonding area, and the first terminal includes a first electrode, a second electrode, and a third electrode positioned on the substrate and electrically connected to each other, the first electrode, the second electrode, and the third electrode are provided in a stack, the first electrode and the gate are provided in a same layer, the second electrode is provided in the same layer as the active member, and is formed in the same process as the source and drain, and the third electrode is positioned on the second insulating layer.

Beneficial Effect

In this application, a multi-tone photomask is configured to simultaneously form an active member and an opening of the first electrode of the bonding terminal of the flexible circuit board, so that the third conductive layer can simultaneously form a source and drain, a second electrode of the bonding terminal of the flexible circuit board, and a bonding terminal of the light-emitting element, which reduces a number of etching times in the process, reduces the difficulty in the manufacturing of the backlight module, and improves the process efficiency.

DETAILED DESCRIPTION OF PREFERRED EMBODIMENTS

In order to make the purpose, technical solutions, and effects of this application clear, the following further describes this application in detail with reference to the drawings and embodiments. It should be understood that the specific embodiments described here are only used to explain the application, and not used to limit the application.

The current manufacturing process of the backlight module usually requires multiple photomasks and multiple wet and dry etching processes, and excessive number of etching times increases the process difficulty of the driving circuit board, resulting in an increase in cost.

Figure 1:
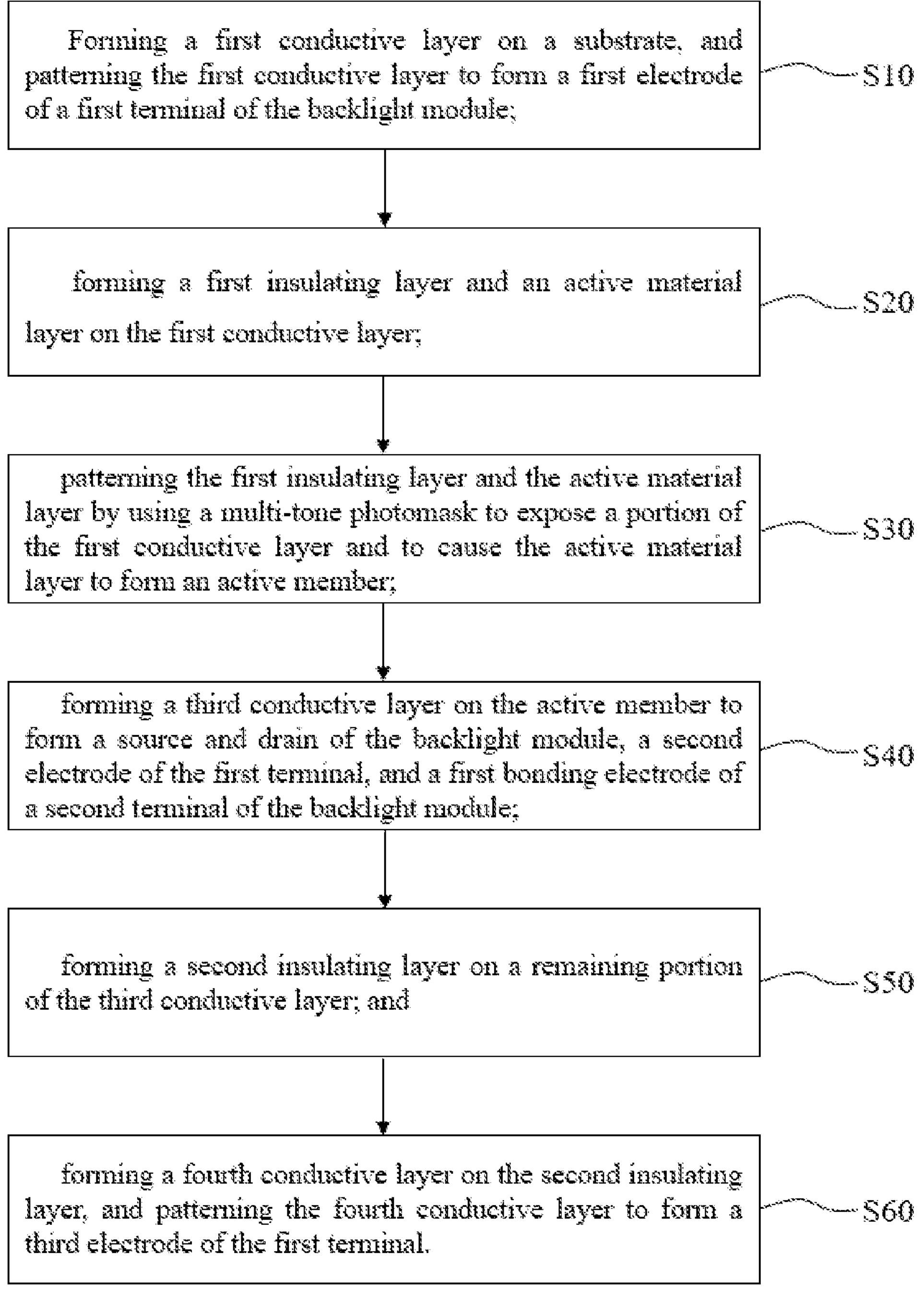
FIG. 1 is a flowchart of a manufacturing method of a backlight module in the present application.
Figure 2:
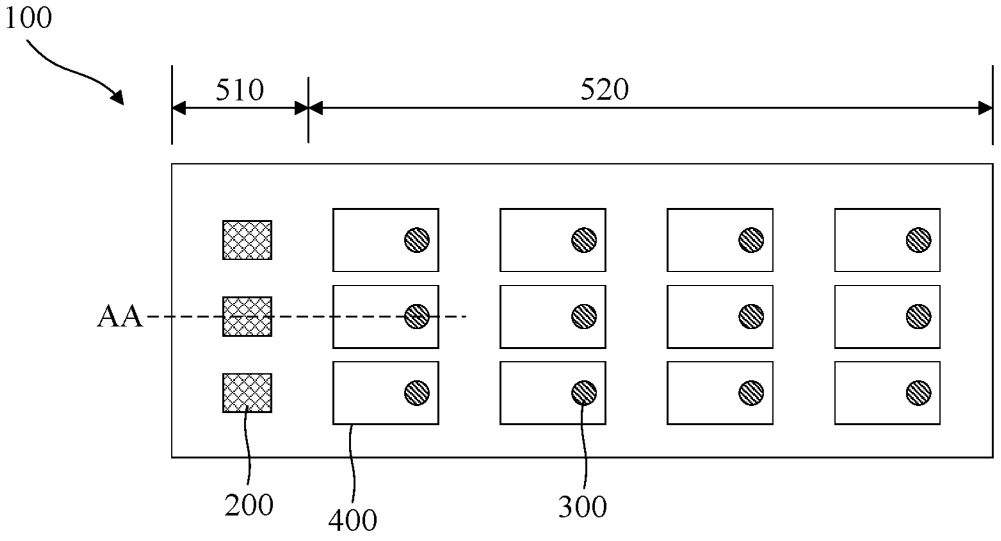
FIG. 2 is a top view of a structure of the backlight module in the present application.

Please refer to FIG. 1 to FIG. 3. This application proposes a manufacturing method of a backlight module 100, which includes:

S10, forming a first conductive layer 20 on a substrate 10, and the first conductive layer 20 is patterned to form a first electrode 202 of a first terminal 200 of the backlight module 100;

S20, forming a first insulating layer 30 and an active material layer 40 on the first conductive layer 20;

S30, patterning the first insulating layer 30 and the active material layer 40 by using a multi-tone photomask 80 to expose a portion of the first conductive layer 20, and cause the active material layer 40 to form an active member 401;

S40, forming a third conductive layer 50 on the active member 401 to form a source and drain of the backlight module 100, a second electrode 502 of the first terminal 200, and a first bonding electrode 503 of a second terminal 300 of the backlight module 100;

S50, forming a second insulating layer 60 on a remaining portion of the third conductive layer 50; and S60, forming a fourth conductive layer 70 on the second insulating layer 60, and the fourth conductive layer 70 is patterned to form a third electrode 701 of the first terminal 200.

In this application, a multi-tone photomask 80 is configured to simultaneously form an active member 401 and an opening of the first electrode 202 of the bonding terminal of the flexible circuit board, so that the third conductive layer 50 can simultaneously form a source and drain, a second electrode 502 of the bonding terminal of the flexible circuit board, and a bonding terminal of the light-emitting element, which reduces the number of etching times in the manufacturing process, reduces the difficulty in the manufacturing of the backlight module 100, and improves the process efficiency.

The technical solution of the present application will be described below with reference to the specific embodiments.

Please refer to FIG. 2, the backlight module 100 includes a plurality of light-emitting units and a bonding area at an edge of the backlight module. A plurality of first terminals 200 are arranged in the bonding area, and a thin film transistor and a second terminal 300 for connecting with a light-emitting device are provided in any of the light-emitting units.

In this embodiment, the backlight module 100 includes a driving circuit layer on the substrate 10, and the driving circuit layer may include a plurality of thin-film transistors. The thin film transistor may be a structure of an etch-stop type, a back-channel etch type, or a top-gate thin-film transistor type, and there is no specific limitation. This application takes the traditional back-channel etch type as an example for description.

In this embodiment, please refer to FIG. 3A to FIG. 3L. FIG. 3A to FIG. 3L are all partial cross-sectional views of FIG. 2 with AA as a cross-section. Step S10 may specifically include S101, forming a first conductive layer 20 on the substrate 10. In this step, the material of the substrate 10 can be determined according to the rigidity and flexibility of the product, such as a rigid material of glass, quartz, or a flexible material of polyimide.

Figure 3A:
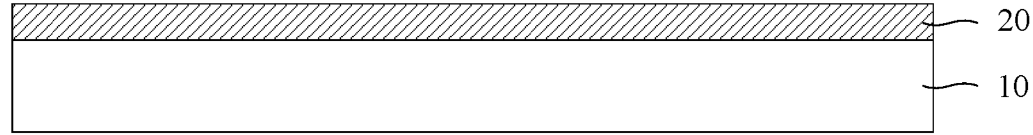
FIG. 3A is a schematic diagram of a first process flow of the manufacturing method of the backlight module in the present application.
Figure 3B:
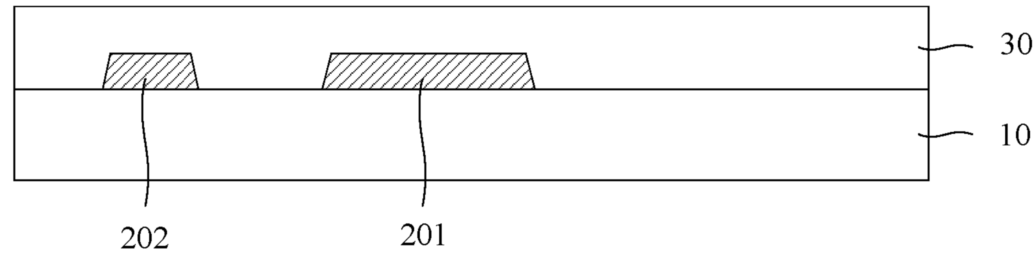
FIG. 3B is a schematic diagram of a second process flow of the manufacturing method of the backlight module in the present application.

In this step, the first conductive layer 20 shown in FIG. 3A and FIG. 3B can be made of molybdenum, aluminum, aluminum-nickel alloy, molybdenum-tungsten alloy, chromium, or copper, or a combination of the foregoing metal materials. Since the first conductive layer 20 is configured to form a gate 201 of the backlight module 100, the material of the first conductive layer 20 can be molybdenum.

S102, patterning the first conductive layer by using a first photomask and a first etching process to form a gate 201 of the backlight module 100 and a first electrode 202 of the first terminal 200 of the backlight module 100.

In this step, a photoresist material layer is coated on the first conductive layer 20, and a predetermined photomask is used to perform a photolithography process on the photoresist material layer. After a development process, the photoresist material layer is patterned, and the first conductive layer 20 is etched by the first etching process so that the first conductive layer 20 forms a gate 201 of the backlight module 100 and a first electrode 202 of the first terminal 200 of the backlight module 100.

In this step, the first etching process may be a wet etching process.

S103, forming the first insulating layer 30 on the patterned first conductive layer 20.

Figure 3C:
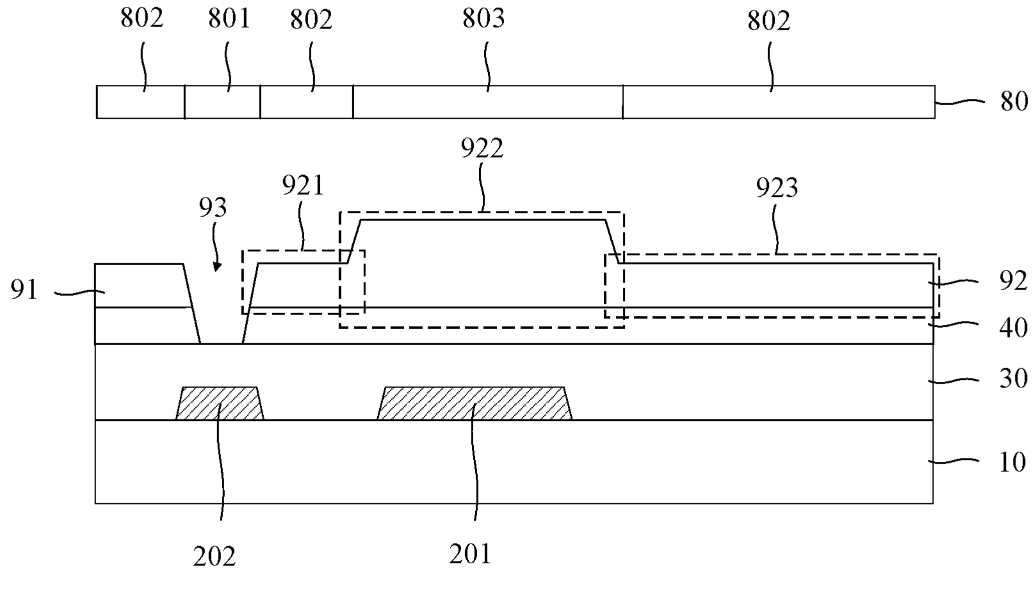
FIG. 3C is a schematic diagram of a third process flow of the manufacturing method of the backlight module in the present application.

In this embodiment, referring to FIG. 3C, step S30 may specifically include S301, forming a photoresist material layer on the active material layer 40. In this step, the active material layer 40 may be a semiconductor oxide, such as indium gallium zinc oxide.

S302, patterning the photoresist material layer by using a second photomask to form a first photoresist area 91 and a second photoresist area 92 separated from each other and a first opening area 93 positioned between the first photoresist area 91 and the second photoresist area 92.

In this step, the second photoresist area 92 includes a first photoresist sub-area 921, a second photoresist sub-area 922, and a third photoresist sub-area 923 connected to each other. The first photoresist sub-area 921 and the third photoresist sub-area 923 are on both sides of the second photoresist sub-area 922. The thickness of the first photoresist sub-area 921 is less than that of the second photoresist sub-area 922. The thickness of the first photoresist sub-area 921 is equal to that of the third photoresist sub-area 923. The thickness of the first photoresist sub-area 921 is equal to that of the first photoresist area 91.

In this step, the multi-tone photomask 80 includes a first photomask area 801, a second photomask area 802, and a third photomask area 803; the first photomask area 801 corresponds to the first opening area 93, the second photomask area 802 corresponds to the first photoresist area 91 and the first photoresist sub-area 921, and the third photomask area 803 corresponds to the second photoresist sub-area 922 and the third photoresist sub-area 923; and light transmittance of the first photomask area 801, the second photomask area 802, and the third photomask area 803 gradually increase or decrease.

For example, when the photoresist material is a positive photoresist, the light transmittance of the first photomask area 801 may be 100%, the light transmittance of the second photomask area 802 may be 50%, and the light transmittance of the third photomask area 803 may be zero. The light transmittance of the first photomask area 801, the second photomask area 802, and the third photomask area 803 gradually decrease. After a development process, the photoresist material corresponding to the first photomask area 801 is completely removed, the thickness of the photoresist material corresponding to the second photomask area 802 becomes half of its original thickness, and the photoresist material corresponding to the third photomask area 803 is completely retained.

For example, when the photoresist material is a negative photoresist, the light transmittance of the first photomask area 801 may be zero, the light transmittance of the second photomask area 802 may be 50%, and the light transmittance of the third photomask area 803 may be 100%. The light transmittance of the first photomask area 801, the second photomask area 802, and the third photomask area 803 gradually increase. After a development process, the photoresist material corresponding to the first photomask area 801 is retained, the thickness of the photoresist material corresponding to the second photomask area 802 becomes half of its original thickness, and the photoresist material corresponding to the third photomask area 803 is completely removed.

The foregoing embodiment is only one of the conditions, and the specific light transmittance of the first photomask area 801, the second photomask area 802, and the third photomask area 803 can be determined according to actual conditions.

S303, removing portions of the first insulating layer 30 and the first conductive layer 20 that are not covered by the first photoresist area 91 and the second photoresist area 92 by a second etching process, to form a first via-hole 301 to expose the first electrode 202 corresponding to the first opening area 93.

In this embodiment, the second etching process includes a first wet etching and a first dry etching. The first wet etching is used to remove the active material layer 40 corresponding to the first opening area 93, and the first dry etching is used to remove the first insulating layer 30 corresponding to the first opening area 93 to form the first via-hole 301 so that a portion of the first electrode 202 is exposed.

S304, performing an ashing treatment on photoresist material in the first photoresist area 91 and the second photoresist area 92, and retaining the photoresist material in a portion of the second photoresist area.

Figure 3D:
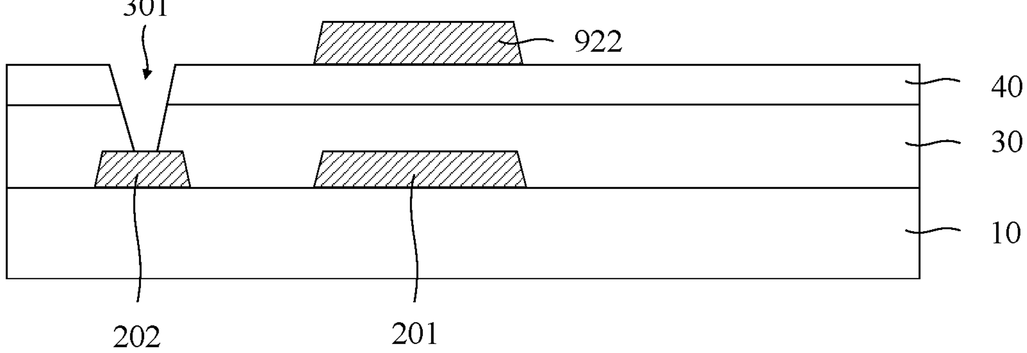
FIG. 3D is a schematic diagram of a fourth process flow of the manufacturing method of the backlight module in the present application.

Please refer to FIG. 3D. In this step, the ashing treatment is mainly used to remove the photoresist material in the first photoresist sub-area 921 in the first photoresist area 91 and the second photoresist area 92, and to reduce the thickness of the second photoresist sub-area 922 in the second photoresist area 92 to form the portion of the second photoresist area 92.

In this embodiment, the ashing treatment generally uses plasma gas to remove the photoresist material, and the plasma gas may be, but is not limited to, oxygen, nitrogen, or the like.

Figure 3E:
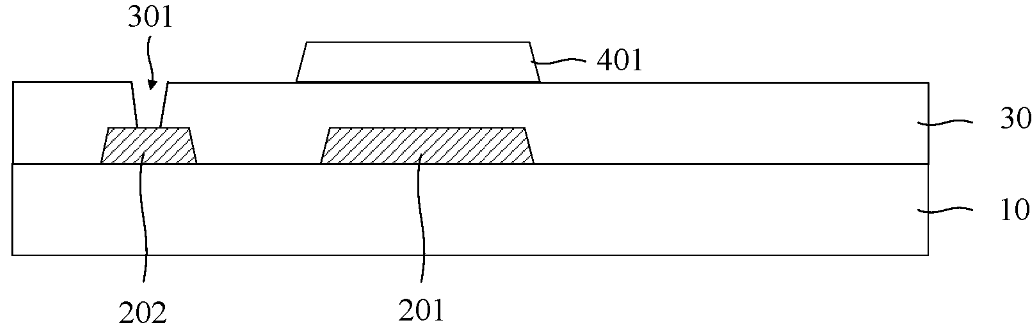
FIG. 3E is a schematic diagram of a fifth process flow of the manufacturing method of the backlight module in the present application.

Alternatively, in the processes of FIG. 3D to FIG. 3E, the step of the ashing treatment can be omitted. That is, the active material layer 40 corresponding to the first opening area 93 is removed by the above-mentioned first wet etching, and the first insulating layer 30 corresponding to the first opening area 93 is removed by the first dry etching, and the photoresist material in the first photoresist sub-area 921 and the third photoresist sub-area 923 in the first photoresist area 91 and the second photoresist area 92 is removed by the first dry etching. Further, the thickness of the second photoresist sub-area 922 in the second photoresist area 92 is reduced to form the portion of the second photoresist area 92. That is, the above-mentioned dry etching process is used to replace the ashing treatment so as to simplify the manufacturing process. S305, a third etching process is used to remove the active material layer 40 not covered by a portion of the photoresist material in the second photoresist area 92 to form the active member 401.

Please refer to FIG. 3E. In this step, the active material layer 40 is patterned mainly through the third etching process to form the active member 401 of the backlight module 100.

Figure 3F:
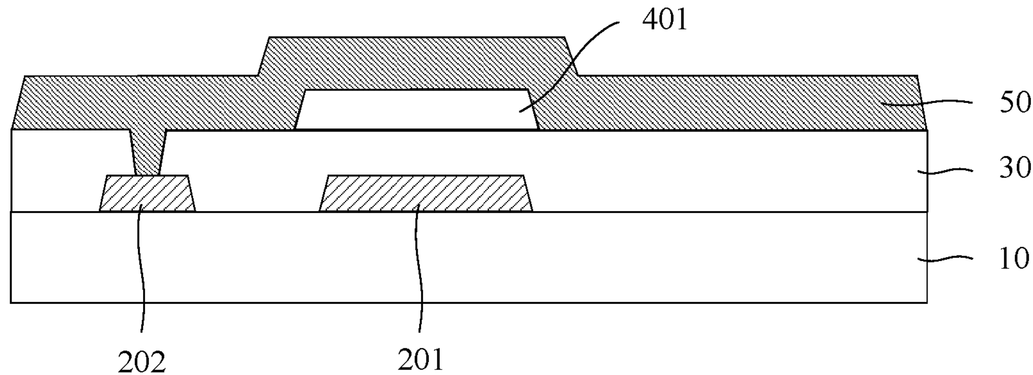
FIG. 3F is a schematic diagram of a sixth process flow of the manufacturing method of the backlight module in the present application.
Figure 3G:
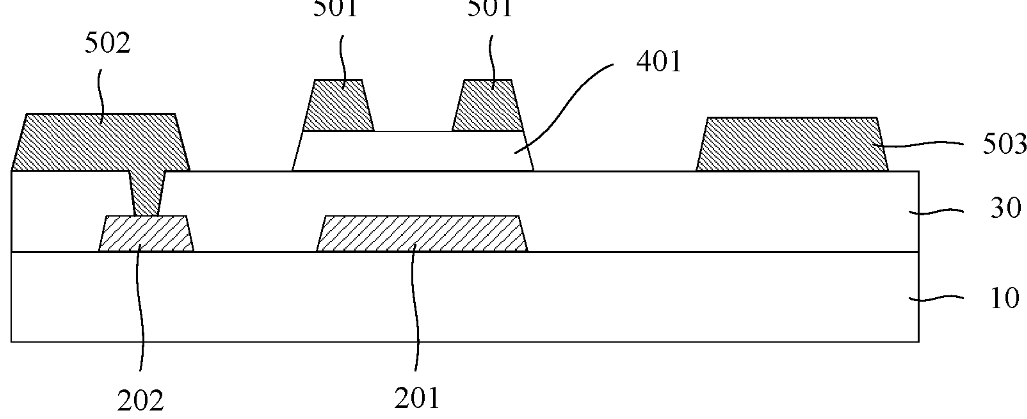
FIG. 3G is a schematic diagram of a seventh process flow of the manufacturing method of the backlight module in the present application.

In this embodiment, referring to FIG. 3F to FIG. 3G, step S40 may specifically include:

S401, forming a third conductive layer 50 on the active member 401;

S402, patterning the third conductive layer 50 by using a third photomask and a fourth etching process so that the third conductive layer 50 forms the source and drain 501 of the backlight module 100, the second electrode 502 of the first terminal 200, and the first bonding electrode 503 of the second terminal 300.

In this embodiment, the metal material of the third conductive layer 50 generally requires materials with better bending performance and conductive performance, as well as the function of preventing oxidation. For example, the metal material of the third conductive layer 50 may be a titanium aluminum alloy, that is, a sandwich structure of titanium-aluminum-titanium is formed.

In this embodiment, the source and drain 501 are positioned on the active member 401, and the active member 401 serves as a switch corresponding to the thin film transistor.

In this embodiment, the second electrode 502 of the first terminal 200 is electrically connected to the first electrode 202 through the first via-hole 301. The number of the first via-hole 301 is not limited to one and can be multiple.

In this embodiment, the second terminal 300 and the first terminal 200 are positioned on both sides of the backlight module 100 to avoid arranging two connection terminals on the same side to increase the distance between the lower frames or the upper frames.

In this embodiment, the first terminal 200 is a terminal connected to a flexible circuit board, and the second terminal 300 is a terminal connected to a light-emitting device, such as a micro light-emitting diode (LED) or a mini LED.

In this embodiment, the second electrode 502 of the first terminal 200 and the first bonding electrode 503 of the second terminal 300 can be formed in the same process as the active material layer 40. That is, before forming the active member 401, the first via-hole 301 is first etched. Secondly, when the active material layer 40 is formed, the active material layer 40 is patterned with the same photomask to form the second electrode 502 of the first terminal 200, the first bonding electrode 503 of the second terminal 300, and the active member 401.

Alternatively, on the basis of the foregoing embodiment, the active member 401 and the first bonding electrode 503 of the second terminal 300 are formed by the active material layer 40, and the second electrode 502 of the first terminal 200 is formed by the third conductive layer 50.

In this embodiment, the fourth etching process may be wet etching.

In this embodiment, after forming the source and drain 501, the process further includes: S50, forming a second insulating layer 60 on a remaining portion of the third conductive layer 50; and patterning the second insulating layer 60 by using a fourth photomask and a fifth etching process to form a second via-hole 601 positioned on the second electrode 502 and a second opening 602 positioned on the first bonding electrode 503.

Figure 3H:
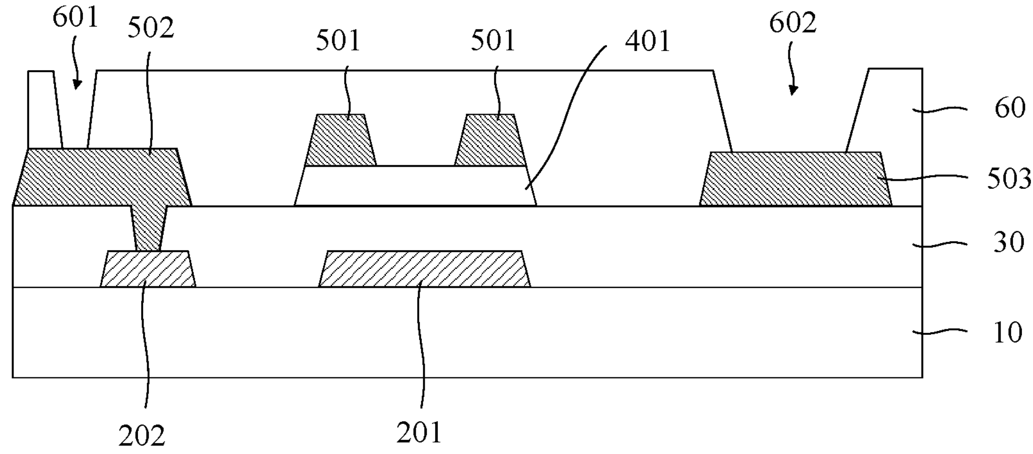
FIG. 3H is a schematic diagram of an eighth process flow of the manufacturing method of the backlight module in the present application.

Referring to FIG. 3H, the material of the second insulating layer 60 can be the same as that of the first insulating layer 30. For example, inorganic compounds such as silicon-oxygen compounds and carbon-silicon compounds.

In this step, since the bonding terminal of the flexible circuit board is a bonding end, the structure of the first terminal 200 needs to protrude from the backlight module 100. That is, a second via-hole 601 is formed on the second electrode 502 to form a third electrode 701 on the second insulating layer 60, and the third electrode 701 is electrically connected to the second electrode 502 through the second via-hole 601. Secondly, since the light-emitting device structure can be embedded in the backlight module 100, it can form the second opening 602 with a larger diameter.

In this embodiment, the fifth etching process may be a dry etching process.

Figure 3I:
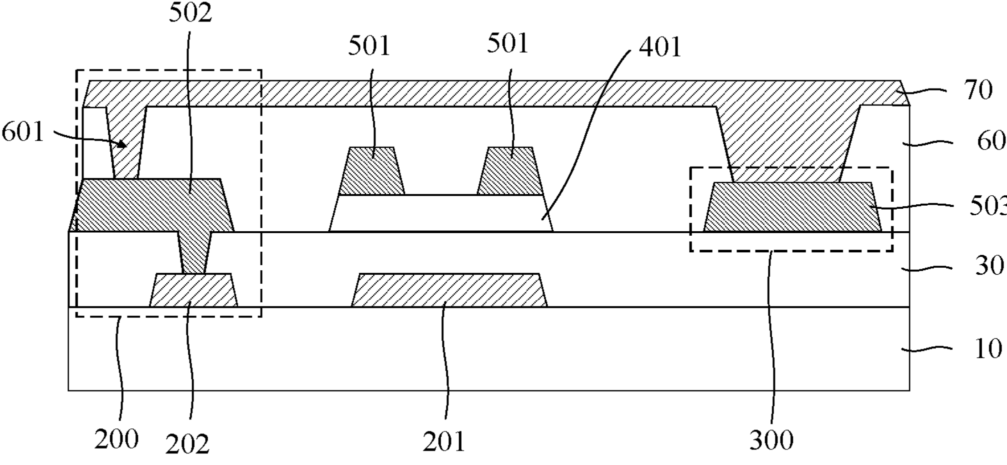
FIG. 3I is a schematic diagram of a ninth process flow of the manufacturing method of the backlight module in the present application.
Figure 3J:
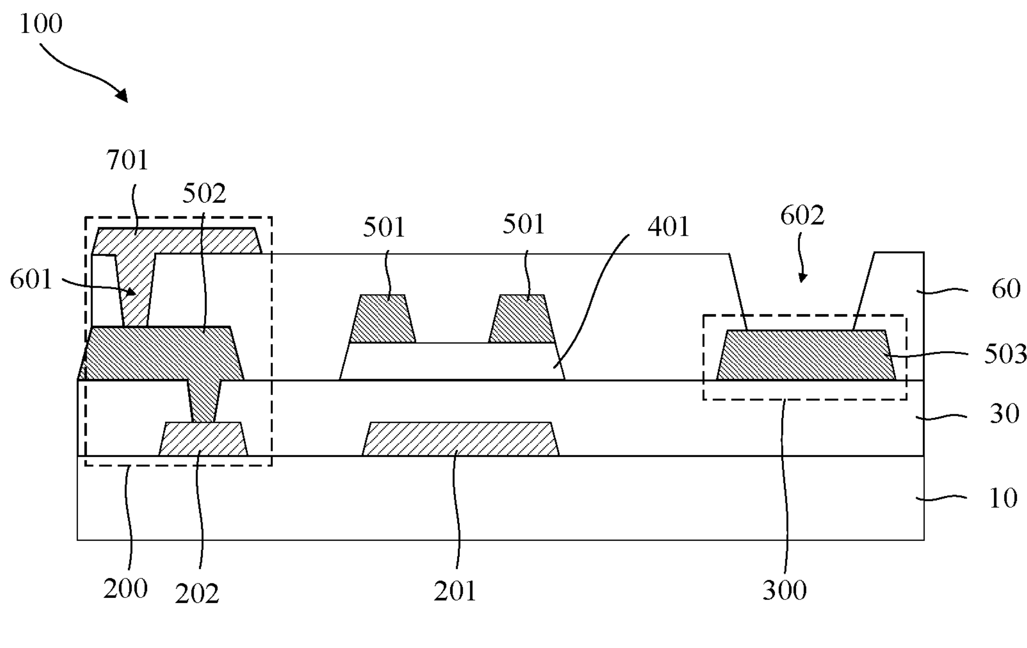
FIG. 3J is a schematic diagram of a tenth process flow of the manufacturing method of the backlight module in the present application.

Please refer to FIG. 3I to FIG. 3J, the material of the fourth conductive layer 70 is mainly a pixel electrode. For example, it may be, but is not limited to, indium tin oxide, or other metal materials with good conductivity. The manufacturing of the pixel electrode is mainly used to form a third electrode 701 of the first terminal 200, the third electrode 701 is electrically connected to the second electrode 502 through the second via-hole 601, and the third electrode 701 is mainly configured to electrically connect with the corresponding port of the flexible circuit board.

Figure 3K:
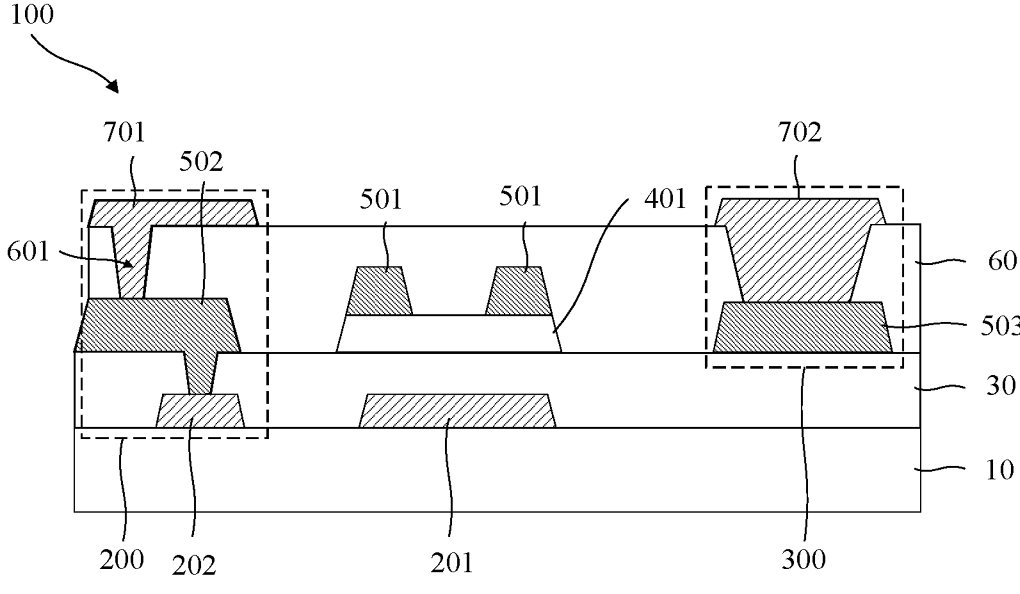
FIG. 3K is a schematic diagram of an eleventh process flow of the manufacturing method of the backlight module in the present application.

In this embodiment, referring to FIG. 3K, the above steps may also include patterning the fourth conductive layer 70 by using a fifth photomask so that the fourth conductive layer 70 forms a third electrode 701 of the first terminal 200 and a second bonding electrode of the second terminal 300. The third electrode 701 is electrically connected to the second electrode 502 through the second via-hole 601, and the second bonding electrode 702 is electrically connected to the first bonding electrode 503 through the second opening 602.

This step is similar to the structure shown in FIG. 3G, and it mainly uses the fourth conductive layer 70 to simultaneously form the third electrode 701 of the first terminal 200 and the second bonding electrode of the second terminal 300. The newly added second bonding electrode is built into the second opening 602, and the size of the corresponding light-emitting device is not limited to the size of the opening. It can be arranged on the backlight module 100 like a flexible circuit board.

Figure 3L:
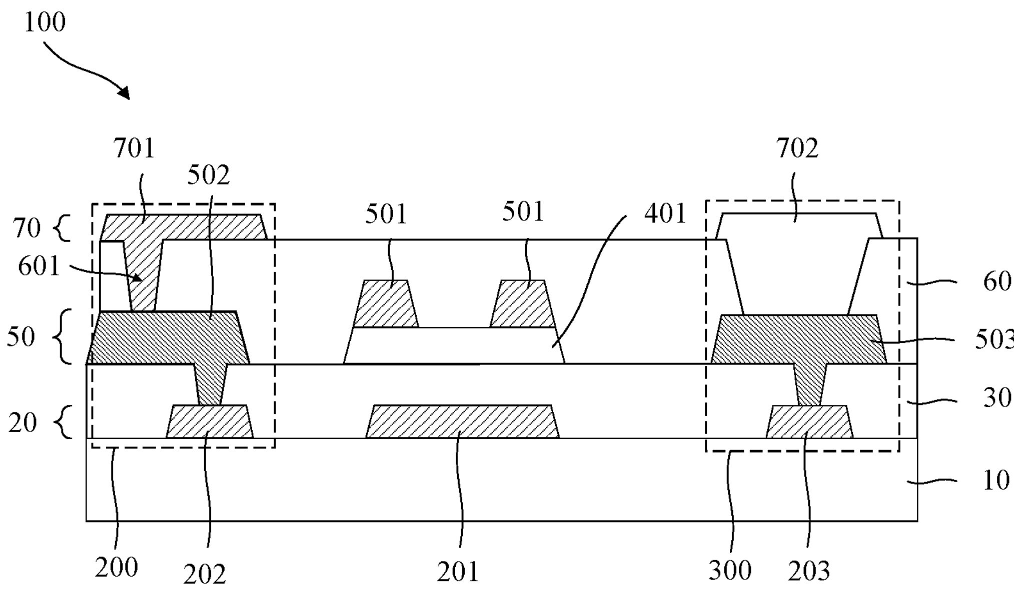
FIG. 3L is a schematic diagram of a twelfth process flow of the manufacturing method of the backlight module of the present application.

In this embodiment, referring to FIG. 3L, the step of forming the first conductive layer 20 and the first insulating layer 30 on the substrate 10 may include: forming the first conductive layer 20 on the substrate 10; and the first conductive layer 20 is patterned by using a first photomask and a first etching process so that the first conductive layer 20 forms a gate 201 of the backlight module 100, a first electrode 202 of the first terminal 200 of the backlight module 100, and a third bonding electrode 203 of the second terminal 300; and the first insulating layer 30 is formed on the patterned first conductive layer 20.

In this step, compared with FIG. 3J or FIG. 3K, the second terminal 300 of the present application further includes a third bonding electrode on the substrate 10. The three-layer bonding electrodes of the present application can be electrically connected in pairs, and the arrangement of the multilayer bonding electrodes can improve the stability of the connection between the internal electrodes. For example, when a certain layer of electrodes is disconnected, it can transmit signals through the other two layers of electrodes.

In this embodiment, the three layers of electrodes in the first terminal 200 can also be electrically connected between any two layers of the electrodes, which will not be described in detail here.

With the structure disclosed above, this application only needs the second etching process, the third etching process, and the fourth etching process to complete the patterning process of the active member 401 and the third conductive layer 50. It is equivalent to three wet etchings and one dry etching. Compared with the prior art, the number of etching times is reduced, the process is simplified, and the efficiency of the process is improved.

Please refer to FIG. 2 and FIG. 3J to FIG. 3L. This application also proposes a backlight module 100. The backlight module 100 includes a light-emitting area 520 and a first bonding area 510 away from the light-emitting area 520.

A plurality of light-emitting units 400 are arranged in the light-emitting area 520. Any of the plurality of light-emitting units 400 includes a substrate 10, a gate 201 positioned on the substrate 10, a first insulating layer 30 positioned on the gate 201, an active member 401 positioned on the first insulating layer 30, a source and drain 501 positioned on the active member 401, a second insulating layer 60 positioned on the source and drain 501, a second terminal 300 positioned in the second insulating layer 60, and a light-emitting device positioned on the second terminal 300. The second terminal 300 includes a first bonding electrode 503 arranged in the same layer as the active member 401 and formed in the same process as the source and drain 501.

At least one first terminal 200 is provided in the first bonding area 510. The first terminal 200 includes a first electrode 202, a second electrode 502, and a third electrode 701 positioned on the substrate 10 and electrically connected to each other. The first electrode 202, the second electrode 502, and the third electrode 701 are provided in a stack. The first electrode 202 and the gate 201 are provided in the same layer, the second electrode 502 is provided in the same layer as the active member 401, and is formed in the same process as the source and drain 501, and the third electrode 701 is positioned on the second insulating layer 60.

The related structure of the backlight module can refer to the structure defined by the manufacturing method of the backlight module, and the working principle and process are the same as or similar to the above, and will not be repeated here.

This application proposes a manufacturing method of a backlight module, which includes: forming a first conductive layer and a first insulating layer on the substrate, forming an active material layer on the first conductive layer, patterning the first insulating layer and the active material layer by using a multi-tone photomask to expose a portion of the first conductive layer and cause the active material layer to form an active member, and forming a third conductive layer on the active member to form a source and drain of the backlight module. In this application, a multi-tone photomask is configured to simultaneously form an active member and an opening of the first electrode of the bonding terminal of the flexible circuit board, so that the third conductive layer can simultaneously form a source and drain, a second electrode of the bonding terminal of the flexible circuit board, and a bonding terminal of the light-emitting element, which reduces the number of etching times of the manufacturing process, simplifies the process difficulty of the backlight module, and improves process efficiency.

It can be understood that, for those of ordinary skill in the art, equivalent replacements or modifications can be made according to the technical solution of the present application and its inventive concept, and all these modifications or replacements shall fall within the protection scope in the claims of the present application.

What is claimed is:

1. A manufacturing method of a backlight module, comprising following steps:

forming a first conductive layer on a substrate, and patterning the first conductive layer to form a first electrode of a first terminal of the backlight module;

forming a first insulating layer and an active material layer on the first electrode and the substrate;

patterning the first insulating layer and the active material layer by using a multi-tone photomask to form a first via-hole exposing a portion of the first electrode and to form an active member from the active material layer;

forming a second conductive layer on the active member and the first insulating layer covering the active member, the first insulating layer and the first via-hole, so that the second conductive layer is in direct contact with both the first insulating layer in an area outside the first via-hole and the active member in the area outside the first via-hole;

patterning the second conductive layer to form a source and a drain of the backlight module on the active member, a second electrode of the first terminal on the first insulating layer, and a first bonding electrode of a second terminal of the backlight module on the first insulating layer, wherein the second electrode is in direct contact with the first insulating layer in the area outside the first via-hole and the first bonding electrode and the active member are each in direct contact with the first insulating layer;

forming a second insulating layer on the second conductive layer covering at least the second electrode, the first bonding electrode, and the source and drain; and forming a third conductive layer on the second insulating layer, and patterning the third conductive layer to form a third electrode of the first terminal.

2. The manufacturing method of the backlight module according to claim 1, wherein the step of forming the first conductive layer on the substrate, and patterning the first conductive layer to form the first electrode of the first terminal of the backlight module comprises:

forming the first conductive layer on the substrate; and patterning the first conductive layer to form a gate of the backlight module and the first electrode of the first terminal of the backlight module.

3. The manufacturing method of the backlight module according to claim 1, wherein the step of patterning the first insulating layer and the active material layer by using the multi-tone photomask to form the first via-hole exposing the portion of the first electrode and to form an active member from the active material layer comprises:

forming a photoresist material layer on the active material layer;

patterning the photoresist material layer, wherein the patterned photoresist material layer comprises a first photoresist area and a second photoresist area separated from each other and a first opening area positioned between the first photoresist area and the second photoresist area;

removing a portion of the first insulating layer and a portion of the active material layer that correspond to the first opening area to form the first via-hole exposing the first electrode corresponding to the first opening area;

performing an ashing treatment on the first photoresist area and the second photoresist area to remove the first photoresist area and retain a portion of the second photoresist area; and removing a portion of the active material layer that is not covered by the portion of the second photoresist area to form the active member.

4. The manufacturing method of the backlight module according to claim 3, wherein the second photoresist area comprises a first photoresist sub-area, a second photoresist sub-area, and a third photoresist sub-area connected to each other, the first photoresist sub-area is close to the first photoresist area, the first photoresist sub-area and the third photoresist sub-area are on opposite sides of the second photoresist sub-area, a thickness of the first photoresist sub-area is less than a thickness of the second photoresist sub-area, and the thickness of the first photoresist sub-area is equal to a thickness of the third photoresist sub-area, and wherein the step of performing the ashing treatment on the first photoresist area and the second photoresist area to remove the first photoresist area and retain the portion of the second photoresist area comprises:

removing the first photoresist area, the first photoresist sub-area and the third photoresist sub-area, and reducing the thickness of the second photoresist sub-area of the second photoresist area to form the portion of the second photoresist area.

5. The manufacturing method of the backlight module according to claim 4, wherein the multi-tone photomask comprises a first photomask area, a second photomask area, and a third photomask area; the first photomask area corresponds to the first opening area, the second photomask area corresponds to the first photoresist area, the first photoresist sub-area and the third photoresist sub-area, and the third photomask area corresponds to the second photoresist sub-area; and light transmittance of the first photomask area, the second photomask area, and the third photomask area gradually increase or decrease.

6. The manufacturing method of the backlight module according to claim 1, wherein, the source and drain are positioned on the active member, and the second electrode is electrically connected to the first electrode through the first via-hole.

7. The manufacturing method of the backlight module according to claim 1, wherein the step of forming the second insulating layer on the second conductive layer further comprises patterning the second insulating layer to form a second via-hole on the second electrode and a second opening on the first bonding electrode.

8. The manufacturing method of the backlight module according to claim 7, wherein the third electrode is electrically connected to the second electrode through the second via-hole.

9. The manufacturing method of the backlight module according to claim 1, wherein the step of patterning the first insulating layer and the active material layer by using the multi-tone photomask to form the first via-hole exposing the portion of the first electrode and to form an active member from the active material layer comprises:

forming a photoresist material layer on the active material layer;

patterning the photoresist material layer, wherein the patterned photoresist material layer comprises a first photoresist area and a second photoresist area separated from each other and a first opening area positioned between the first photoresist area and the second photoresist area;

removing, by wet etching, a portion of the active material layer that corresponds to the first opening area;

removing, by dry etching, a portion of the first insulating layer that corresponds to the first opening area to form the first via-hole, removing, by dry etching, the first photoresist area and a first portion of the second photoresist area to leave a second portion of the second photoresist area; and removing a portion of the active material layer that is not covered by the second portion of the second photoresist area to form the active member.

10. A manufacturing method of a backlight module, comprising following steps:

forming a first conductive layer on a substrate, and patterning the first conductive layer to form a first electrode of a first terminal of the backlight module and a first bonding electrode of a second terminal of the backlight module;

forming a first insulating layer and an active material layer on the first electrode, the first bonding electrode and the substrate;

patterning the first insulating layer and the active material layer by using a multi-tone photomask to form a first via-hole exposing a portion of the first electrode and to form an active member from the active material layer;

forming a second conductive layer on the active member and the first insulating layer covering the active member, the first insulating layer and the first via-hole, so that the second conductive layer is in direct contact with both the first insulating layer in an area outside the first via-hole and the active member in the area outside the first via-hole;

patterning the second conductive layer to form a source and a drain of the backlight module on the active member, a second electrode of the first terminal on the first insulating layer, and a second bonding electrode of a second terminal of the backlight module on the first insulating layer, wherein the second electrode is in direct contact with the first insulating layer in the area outside the first via-hole and the second bonding electrode and the active member are each in direct contact with the first insulating layer;

forming a second insulating layer on the second conductive layer covering at least the second electrode, the second bonding electrode, and the source and drain; and forming a third conductive layer on the second insulating layer, and patterning the third conductive layer to form a third electrode of the first terminal.

11. The manufacturing method of the backlight module according to claim 10, wherein the step of forming the first conductive layer on the substrate, and patterning the first conductive layer to form the first electrode of the first terminal of the backlight module and the first bonding electrode of a second terminal of the backlight module comprises:

forming the first conductive layer on the substrate; and patterning the first conductive layer to form a gate of the backlight module, and the first electrode of the first terminal of the backlight module, and the first bonding electrode of a second terminal of the backlight module.

12. The manufacturing method of the backlight module according to claim 10, wherein the step of patterning the first insulating layer and the active material layer by using the multi-tone photomask to form the first via-hole exposing the portion of the first electrode and to form an active member from the active material layer comprises:

forming a photoresist material layer on the active material layer;

patterning the photoresist material layer, wherein the patterned photoresist material layer comprises a first photoresist area and a second photoresist area separated from each other and a first opening area positioned between the first photoresist area and the second photoresist area;

removing a portion of the first insulating layer and a portion of the active material layer that corresponds to the first opening area to form the first via-hole exposing the first electrode corresponding to the first opening area;

performing an ashing treatment on the first photoresist area and the second photoresist area to remove the first photoresist area and retain a portion of the second photoresist area; and removing a portion of the active material layer that is not covered by the portion of the second photoresist area to form the active member.

13. The manufacturing method of the backlight module according to claim 12, wherein the second photoresist area comprises a first photoresist sub-area, a second photoresist sub-area, and a third photoresist sub-area connected to each other, the first photoresist sub-area is close to the first photoresist area, the first photoresist sub-area and the third photoresist sub-area are on opposite sides of the second photoresist sub-area, a thickness of the first photoresist sub-area is less than a thickness of the second photoresist sub-area, and the thickness of the first photoresist sub-area is equal to a thickness of the third photoresist sub-area, and wherein the step of performing the ashing treatment on the first photoresist area and the second photoresist area to remove the first photoresist area and retain the portion of the second photoresist area comprises:

removing the first photoresist area, the first photoresist sub-area and the third photoresist sub-area, and reducing the thickness of the second photoresist sub-area of the second photoresist area to form the portion of the second photoresist area.

14. The manufacturing method of the backlight module according to claim 13, wherein the multi-tone photomask comprises a first photomask area, a second photomask area, and a third photomask area; the first photomask area corresponds to the first opening area, the second photomask area corresponds to the first photoresist area, the first photoresist sub-area and the third photoresist sub-area, and the third photomask area corresponds to the second photoresist sub-area; and light transmittance of the first photomask area, the second photomask area, and the third photomask area gradually increase or decrease.

15. The manufacturing method of the backlight module according to claim 10, wherein, the source and the drain are positioned on the active member, and the second electrode is electrically connected to the first electrode through the first via-hole.

16. The manufacturing method of the backlight module according to claim 10, wherein the step of forming the second insulating layer on the second conductive layer further comprises patterning the second insulating layer to form a second via-hole on the second electrode and a second opening on the second bonding electrode.

17. The manufacturing method of the backlight module according to claim 16, wherein the third electrode is electrically connected to the second electrode through the second via-hole.

18. The manufacturing method of the backlight module according to claim 10, wherein the third conductive layer is made of indium tin oxide.

* * * * *